(12) United States Patent
Mun

(10) Patent No.: US 9,391,221 B2
(45) Date of Patent: Jul. 12, 2016

(54) SOLAR CELL MODULE AND APPARATUS FOR GENERATING PHOTOVOLTAIC POWER

(75) Inventor: Hyunrok Mun, Seoul (KR)

(73) Assignee: LG Electronics Inc., Seoul (KR)

( * ) Notice: Subject to any disclaimer, the term of this patent is extended or adjusted under 35 U.S.C. 154(b) by 438 days.

(21) Appl. No.: 13/617,983

(22) Filed: Sep. 14, 2012

(65) Prior Publication Data

US 2013/0284239 A1 Oct. 31, 2013

(30) Foreign Application Priority Data

Apr. 25, 2012 (KR) ........................ 10-2012-0043365

(51) Int. Cl.
*H01L 31/042* (2014.01)
*H02N 6/00* (2006.01)
*H01L 31/02* (2006.01)
*H02S 30/10* (2014.01)
*H02S 20/23* (2014.01)

(52) U.S. Cl.
CPC ............ *H01L 31/0422* (2013.01); *H01L 31/02* (2013.01); *H02S 20/00* (2013.01); *H02S 20/23* (2014.12); *H02S 30/10* (2014.12); *Y02B 10/12* (2013.01); *Y02E 10/50* (2013.01)

(58) Field of Classification Search
CPC ... H01L 31/0422; H01L 31/042; H02S 20/20; H02S 30/10
USPC ....................................................... 136/244
See application file for complete search history.

(56) References Cited

U.S. PATENT DOCUMENTS

| | | | | |
|---|---|---|---|---|
| 4,582,953 | A | * | 4/1986 | Nagase et al. ................ 136/259 |
| 5,379,596 | A | * | 1/1995 | Grayson ........................ 62/3.62 |
| 2010/0243023 | A1 | * | 9/2010 | Patton et al. .................. 136/244 |

FOREIGN PATENT DOCUMENTS

| | | | |
|---|---|---|---|
| CN | 202034382 U | * | 11/2011 |
| JP | 08008452 A | | 1/1996 |

OTHER PUBLICATIONS

English machine translation of CN 202034382 U, retrieved Jan. 2015.*

* cited by examiner

*Primary Examiner* — Luan Van
*Assistant Examiner* — Angelo Trivisonno
(74) *Attorney, Agent, or Firm* — Dentons US LLP

(57) ABSTRACT

A solar cell module includes a solar cell panel including at least one solar cell; and a frame positioned at a periphery of the solar cell panel. The frame includes an align mark for alignment.

An apparatus for generating photovoltaic power includes a solar cell module including a solar cell panel including at least one solar cell and a frame positioned at a periphery of the solar cell panel; and a supporter where the solar cell module is fixed by a fixer. The frame includes an align mark to align the solar cell module with at least one of the supporter and the fixer.

18 Claims, 7 Drawing Sheets

(a)

(b)

(c)

(d)

SOLAR CELL MODULE AND APPARATUS FOR GENERATING PHOTOVOLTAIC POWER

CROSS-REFERENCE TO RELATED APPLICATION

This application claims the priority benefit of Korean Patent Application No. 10-2012-0043365, filed on Apr. 25, 2012 in the Korean Intellectual Property Office, the disclosure of which is incorporated herein by reference.

BACKGROUND

1. Field of the Disclosure

The present disclosure relates to a solar cell module and an apparatus for generating photovoltaic power including the solar cell module, and more particularly to a solar cell module fixed on a supporter and an apparatus for generating photovoltaic power including the solar cell module.

2. Description of the Related Art

Recently, as existing energy resources such as oil or coal are expected to be exhausted, an interest in alternative energy for replacing oil or coal is increasing. In particular, a solar cell that directly converts or transforms solar energy into electricity using a semiconductor element is gaining attention.

At least one solar cell module including a solar cell is fixed to a rack and the like in order to form an apparatus for generating photovoltaic power. In the prior art, aligning each of the at least one solar cell module with the rack needs much effort and time.

SUMMARY

This disclosure is directed to a solar cell module being able to reduce time to install the solar cell module by easy alignment, and to an apparatus for generating photovoltaic power including the solar cell module.

A solar cell module according to an embodiment includes a solar cell panel including at least one solar cell; and a frame positioned at a periphery of the solar cell panel. The frame includes an align mark for alignment.

An apparatus for generating photovoltaic power according to an embodiment includes a solar cell module including a solar cell panel including at least one solar cell and a frame positioned at a periphery of the solar cell panel; and a supporter where the solar cell module is fixed by a fixer. The frame includes an align mark to align the solar cell module with at least one of the supporter and the fixer.

DETAILED DESCRIPTIONS

Figure 1:
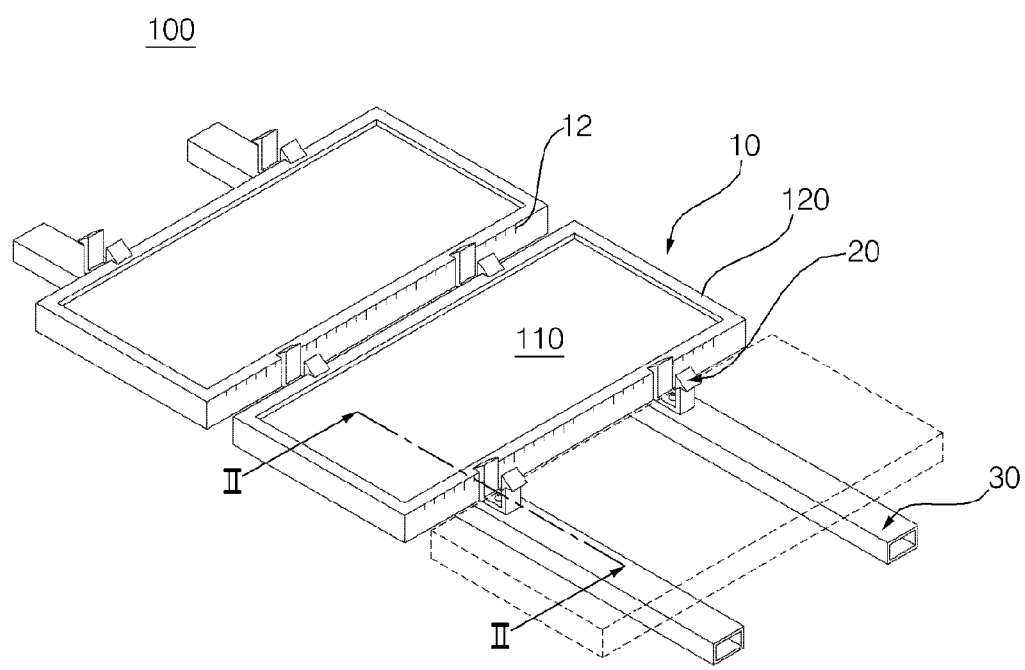
FIG. 1 is a perspective view illustrating an apparatus for generating photovoltaic power according to an embodiment of the present invention.

Hereinafter, embodiments of the present invention will be described with reference to the accompanying drawings. However, the present invention is not limited the embodiments, and the various modifications of the embodiments are possible.

In order to clearly and concisely illustrate the embodiments of the present invention, elements not related to the present invention may be omitted in the figures. Also, elements similar to or the same as each other may have the same reference numerals. In addition, the dimensions of layers and regions may be exaggerated or schematically illustrated, or some layers may be omitted for clarity of illustration. In addition, the dimension of each part as drawn may not reflect an actual size.

In the following description, when a layer or substrate "includes" another layer or portion, it can be understood that the layer or substrate further includes still another layer or portion. Also, when a layer or film is referred to as being "on" another layer or substrate, it can be understood that the layer of film is directly on the other layer or substrate, or intervening layers are also be present. Further, when a layer or film is referred to as being "directly on" another layer or substrate, it can be understood that the layer or film is directly on the another layer or substrate, and thus, there is no intervening layer.

Hereinafter, a solar cell module and an apparatus for generating photovoltaic power according to an embodiment of the present invention will be described with reference to the accompanying drawings.

Figure 2:
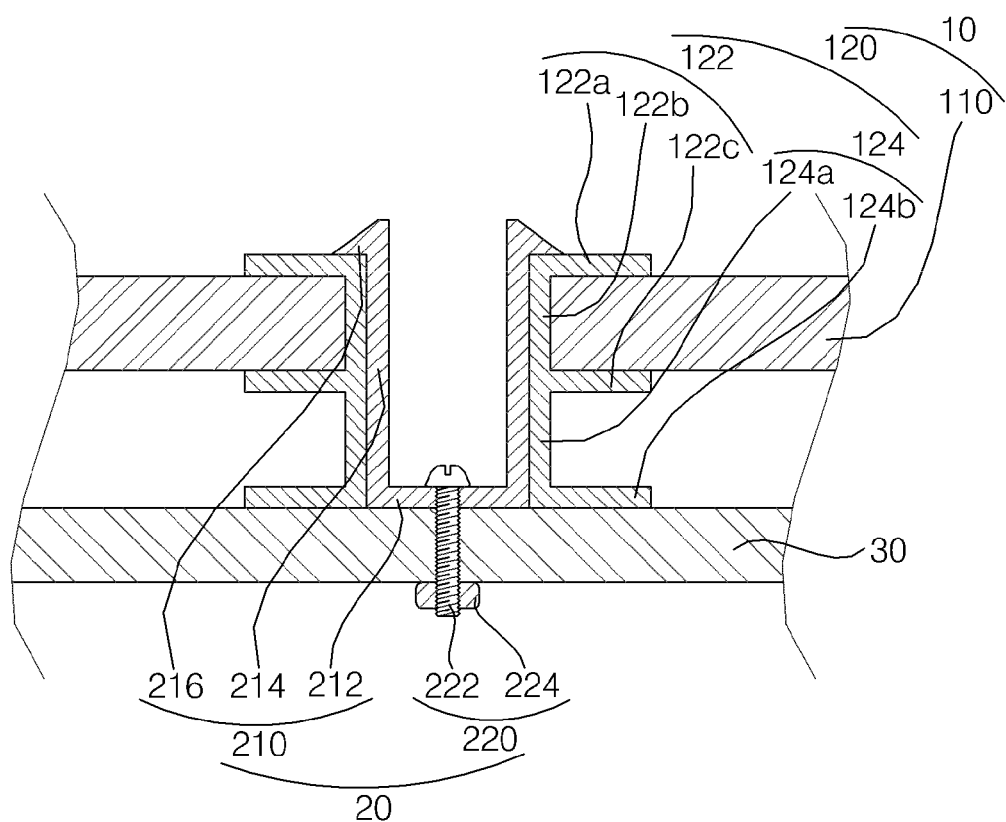
FIG. 2 is a cross-sectional view of the apparatus for generating photovoltaic power, taken along a line of II-II of FIG. 1.

FIG. 1 is a perspective view illustrating an apparatus for generating photovoltaic power according to an embodiment of the present invention. FIG. 2 is a cross-sectional view of the apparatus for generating photovoltaic power, taken along a line of II-II of FIG. 1.

Referring to FIGS. 1 and 2, an apparatus for generating photovoltaic power 100 according to the embodiment includes a solar cell module 10 for converting solar energy to electric energy, and a supporter 30 where the solar cell module 10 is fixed by a fixer 20. Here, the solar cell module 10 includes an align mark 12 for aligning the solar cell module 10 with at least one of the supporter 30 and the fixer 20. This will be described in more detail.

In the embodiment, the solar cell module 10 includes a solar cell panel 110, and a frame 120 positioned at a periphery of the solar cell panel 110. Although it is not shown in drawings, a junction box may be positioned on a rear surface of the solar cell module 10. The junction box may include circuit elements, such as, a capacitor for charging or discharging the electric energy generated from the solar cell panel 110 and a diode for preventing reversal of current.

The solar cell panel 110 includes one solar cell or a plurality of solar cells. For example, the solar cell may be a silicon solar cell, a dye-sensitized solar cell, a compound semiconductor solar cell, or a tandem solar cell.

Figure 3:
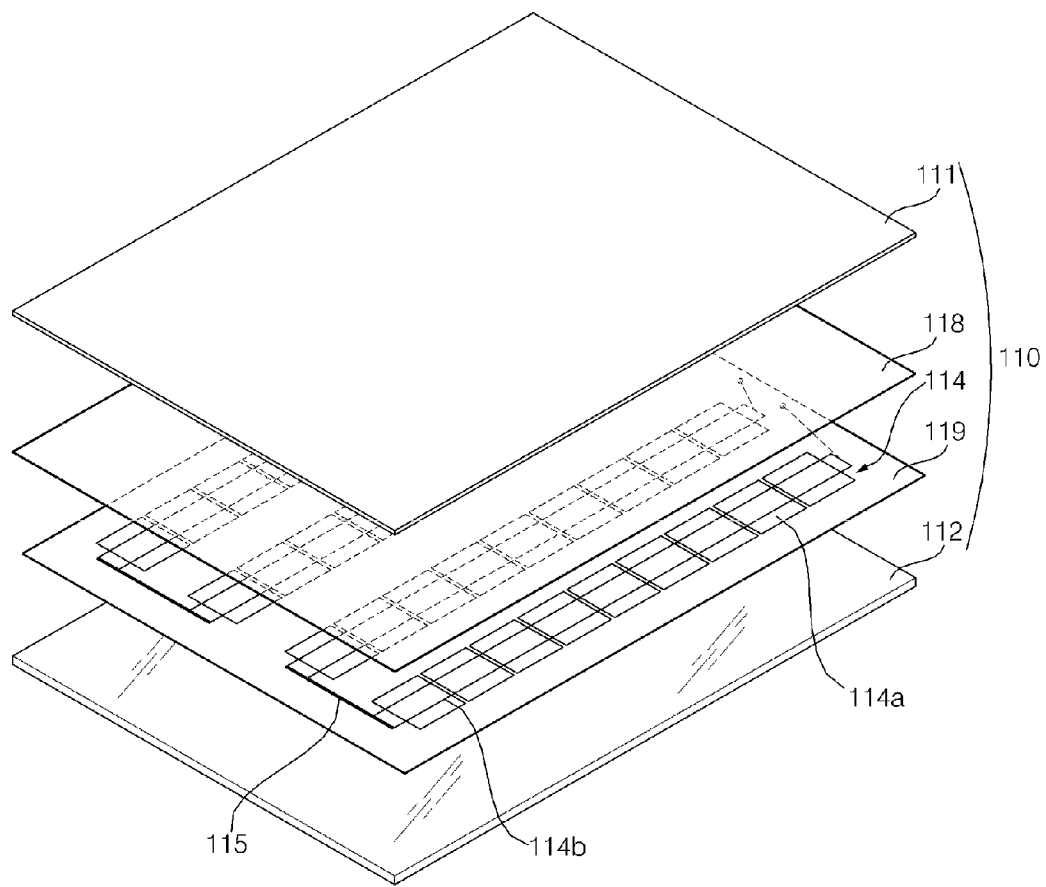
FIG. 3 is an exploded perspective view illustrating an example of a solar cell panel included in the apparatus for generating photovoltaic power, according to the embodiment of the present invention.

Referring to FIG. 3, the solar cell panel 110 including silicon solar cells 114a is described as an example. FIG. 3 is an exploded perspective view illustrating an example of a solar cell panel included in the apparatus for generating photovoltaic power, according to the embodiment of the present invention.

Referring to FIG. 3, the solar cell panel 110 according to the embodiment may include one or more solar cell strings 114 between the front substrate 111 and the rear substrate 112. The solar cell string 114 includes a plurality of solar cells 114a electrically connected to each other in series, in parallel, or in series-and-parallel arrangement. The solar cell panel 110 may further include a first sealing film 118 disposed between the solar cell string 114 and the front substrate 111, and a second sealing film 119 disposed between the solar cell string 114 and the rear substrate 112.

The front substrate 111 may be made of tempered glass for protecting the solar cells 114a from external shock and allowing solar light to pass. Here, the front substrate 111, in order to reduce or prevent solar light from being reflected and to increase transmission of solar light, may be made of low iron tempered glass containing a low iron content. The rear substrate 112 is a layer for protecting the other side of the solar cells 114a, and for water-proofing, insulating, and blocking of ultraviolet rays. The rear substrate 112 may have a TPT (Tedlar/PET/Tedlar) type. However, the embodiments of the invention are not limited thereto. Thus, the rear substrate 112 may be a material having high reflectivity in order to reflect solar light entering the front substrate 111 back to the solar cells 114a. However, the embodiments of the invention are not limited thereto. Thus, the rear substrate 112 may include a transparent material for allowing solar light to pass in order to realize a bi-facial solar cell panel.

Each of the solar cells 114a may include a silicon substrate of a first conductive type, a second conductive type semiconductor layer, an anti-reflection film, a front electrode, and a rear electrode. The second conductive type semiconductor layer is formed on the silicon substrate and has a conductive type opposite to the first conductive type. The anti-reflection film is formed on the second conductive type semiconductor layer, and includes at least one opening for exposing a part of the second conductive type semiconductor layer. The front electrode is in contact with the part of the second conductive type semiconductor layer that is exposed through the at least one opening. The rear electrode is formed on the rear side of the silicon substrate. However, embodiments of the invention are not limited thereto and the solar cells 114a may be different types of solar cells.

The plurality of solar cells 114a are electrically connected by a ribbon or ribbons 114b to form the solar cell string 114. When a plurality of solar cell strings 114 exist, the plurality of solar cell strings are electrically connected by a bus ribbon or bus ribbons 115. However, the embodiments of the invention are not limited thereto, and only one solar cell 114a may be included depending on a type of the solar cell 114a.

The first sealing film 118 and the second sealing film 119 block moisture and/or oxygen that would adversely affect the solar cells 114a. The first and second sealing films 118 and 119 may include one or more of various materials. For example, the first sealing film 118 and the second sealing film 119 may be an ethylene-vinyl acetate copolymer resin (EVA) film. However, the embodiments of the invention are not limited thereto, and various other materials may be used for the first and second sealing films 118 and 119.

As shown in FIGS. 1 and 2, the frame 120 for fixing and combining the solar cell panel 110 is included so as to stably fix the solar cell panel 110 including various layers as in the above.

For example, the frame 120 may include a first portion 122 where at least a part of the solar cell panel 110 is inserted, and a second portion 124 extended from the first portion 122 in a rear direction of the solar cell panel 110.

More specifically, the first portion 122 includes a portion 122a that is positioned on the light-incident surface of the solar cell panel 110, a portion 122b that is positioned on a side surface of the solar cell panel 110, and a portion 122c that is positioned on the rear surface of the solar cell panel 110. The first, second, third portions 122a, 122b and 122c are connected to each other so that the at least a part of the solar cell panel 110 can be inserted into the first portion 122. For example, the first portion 122 may have a "U" shape. In the embodiment, the first portion 122 entirely surrounds the peripheries of the solar cell panel 110. However, the embodiments of the invention are not limited thereto. Accordingly, various modifications (for example, the first portion 122 surrounds a part of the peripheries of the solar cell panel 110) are possible.

The second portion 124 includes a vertical part 124a perpendicular to the solar cell panel 110 and a parallel part 124b parallel to the solar cell panel 110. For example, the second portion 124 may have a "L" shape.

According to the embodiment, the align mark 12 for aligning with the supporter 30 and/or the fixer 20 may be formed at or on the side surface of the frame 120 (that is, the second portion 122b and/or the vertical portion 124a). This will be described in detail after describing the fixer 20 and the supporter 30.

The solar cell module 10 is fixed to the supporter 30 (called "rack", "supporting member", "frame for install", and so on) by the fixer 20.

The supporter 30 may include a material having hardness or stiffness so that the solar cell module 10 can be fixed to and be supported by the supporter 30. For example, the supporter 30 may include a metal or an alloy.

In the drawings, the supporter 30 may have a bar shape extending in one direction, and one supporter 30 is positioned at an upper portion of the solar cell module 10 and the other supporter 30 is positioned at an lower portion of the solar cell module 10. However, the embodiments of the invention are not limited thereto. Thus, the supporter 30 may have a plate shape, or one supporter 30 or three or more supporters 30 corresponds to each of the solar cell module 10. That is, various modifications are possible.

The fixer 20 positioned on the supporter 30 may include a plurality of fixers 20 spaced apart from each other for fixing both sides of the solar cell module 10, that is, on each supporter 30. The fixers 20 are spaced apart from each other with a width of the solar cell module 10.

In the embodiment, the fixer 20 includes a clamping member 210 for surrounding a side surface and a part of a front surface of the frame 120, and a fastening member 220 for fixing the clamping member 210 to the supporter 30.

In this case, the clamping member 210 has hooking portions 216 at both sides, and each hooking portion 216 is formed at each side of the clamping member 210 so that one solar cell module 10 can be inserted into one side of the clamping member 210 and the another solar cell module 10 can be inserted into the other side of the clamping member 210. More particularly, the clamping member 210 includes a bottom portion 212 positioned on the supporter 30, side portions 214 extending from both sides of the bottom portion 212, and the hooking portions 216 bent from the side portions 214 parallel to the supporter 30. Each hooking portion 216 corresponds to each side portion 214.

The fastening member 220 may have a structure of various structures for fastening and fixing the clamping member 210 to the supporter 30. In the embodiment, the fastening member 220 includes a screw (or screws) 222 penetrating the clamping member 210 and the supporter 30, and a nut 224 for fixing the screw 222. Here, a mounting hole may be formed at the bottom portion 212 of the clamping member 210 so that the screw 222 can penetrates the clamping member 222.

Figure 6:
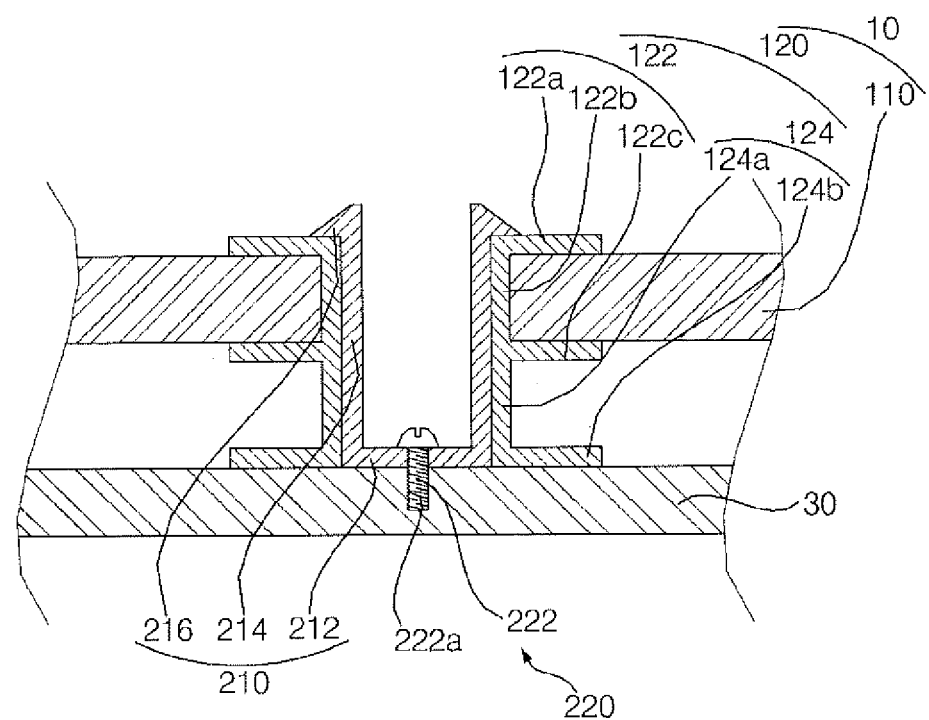
FIG. 6 is a partial cross-sectional view illustrating an apparatus for generating photovoltaic power according to a modified embodiment of the present invention.

However, the embodiments of the invention are not limited thereto. Accordingly, as shown in FIG. 6, as a modified example, a hole 222a that does not penetrate the supporter 30 may be formed at the supporter 30. In this case, the screw 222 is inserted to the mounting hole of the clamping member 210 and the hole 222a of the supporter 30, and the screw 222 is fixed so as not to penetrate the supporter 30. Thus, the nut (224 of FIG. 2) is not necessary.

In the embodiment, the fixer 20 includes the clamping member 210 and the fastening member 220. However, the embodiments of the invention are not limited thereto. Therefore, the fixer 20 may include the fastening member 220 without the clamping member 210, or may include the clamping member 210 without the fastening member 220 (for example, forced-inserting type combination). Also, when the solar cell module 10 and the supporter 30 are fixed by glue or adhesive, the glue or the adhesive is the fixer 20. That is, various structures or methods are applicable to the fixer 20 for fixing the solar cell module 10 to the supporter 30.

In the embodiment, the align mark 12 for aligning with the fixer 20 and/or the supporter 30 is formed at the solar cell module 10. Thereby, aligning the solar cell module 10 with the fixer 20 and/or the supporter 30 can be easy. That is, the position where the fixer 20 and/or the supporter 30 will be positioned can be known by the align mark 12 immediately and easily. Accordingly, the aligning thereof can be accurately performed in a short time.

On the other hand, there is no align mark in the prior art. Thus, aligning each solar cell module with the supporter needs more time or is not accurate.

In the embodiment, the align mark 12 implies a scale including a number, a scale without a number, a number, a character, a symbol, and a figure (such as, circle, polygon, arrow, and so on). As an example, in FIG. 1, the scale without the number is used for the align mark 12. However, the embodiments of the invention are not limited thereto. Various modifications of the align mark 12 will be described later.

The align mark 12 may be formed at or on the frame 120. Thus, the align mark 12 does not affect the solar cell panel 110 substantially participating in the photoelectric transformation. More specifically, the align mark 12 may be formed at the second portion 122b of the frame 120 surrounding the side surface of the solar cell panel 110. Accordingly, the align mark 12 does not negatively affect the front surface where the solar light is incident, and can make the aligning with the fixer 20 and the supporter 30 easy.

Figure 4:
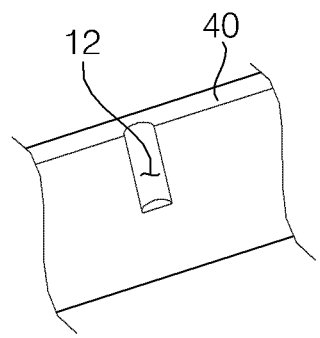
FIG. 4 illustrates various examples of an align mark formed at or on the frame by using various methods, according to embodiments of the present invention.
Figure 4:
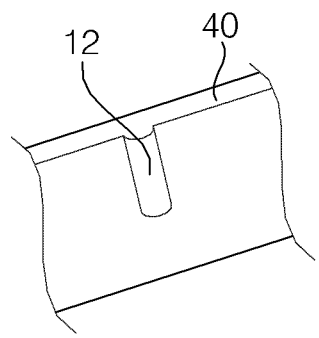
Figure 4:
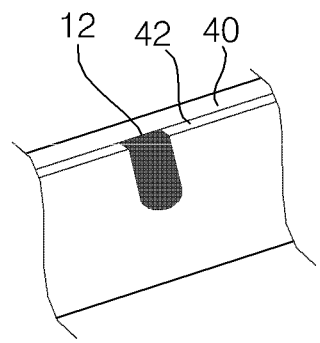
Figure 4:
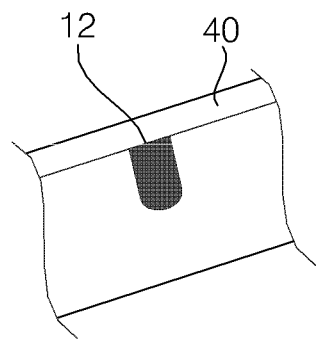

In the embodiment, the align mark 12 is formed at or on the frame 120 by various methods. FIG. 4 illustrates various examples of the align mark 12 formed at or on the frame 120 by using various methods, according to embodiments of the invention.

For example, the align mark 12 may be formed by etching a corresponding portion of the side surface of the frame 120 through irradiating with a laser. Thus, as shown in (a) of FIG. 4, the align mark 12 is an integral part of the frame 120, and has a depression shape corresponding with a part of the frame 120 that is etched. Selectively, the align mark 12 may be formed by metal-working process through a press by using a mold. Thus, as shown in (a) of FIG. 4, the align mark 12 is an integral part of the frame 120, and has a depression shape corresponding with a part of the frame 120 that is depressed. Or, as shown in (b) of FIG. 4, the align mark 12 is an integral part of the frame 120, and has a protrusion shape corresponding with a part of the frame 120 that is protruded.

As such, when the align mark 12 is the integral part of the frame 120, the problem that the align mark 12 falls off from the frame 120 can be fundamentally prevented. Also, the align mark 12 can be used permanently.

Selectively, the align mark 12 may be separately formed from the frame and be positioned on the frame 120. For example, as shown in (c) of FIG. 4, the align mark 12 may be indicated by an ink at a film 42, and the film 42 may be attached on the frame 120. As such, when the align mark 12 is formed at the film 42 that is separate from the frame 120, the film 42 can be easily attached on the frame 120 and be conventionally used. Thus, availability can be enhanced. Selectively, as shown in (d) of FIG. 4, the align mark 12 is formed by printing or by coating an ink on the frame 120.

Referring to FIGS. 1 and 2 again, a coupling scheme of the apparatus for generating photovoltaic power 100 according to the embodiment will be described. The periphery of the solar cell module 10 is inserted to a space formed by the supporter 30, and the side portion 214 and the hooking portion 216 of the clamping member 210. A worker moves the solar cell module 10 while seeing the align mark 12 having the scale shape formed at the second portion 122b (or first portion 122a) of the solar cell module 10. Hereby, the solar cell module 10, the supporter 30, and the fixer 20 can be located to suitable portions.

Likewise, in the embodiment, by using the align mark 12 positioned at the second portion 122b (or first portion 122a) of the solar cell module 10, aligning positions of the solar cell module 10, the fixer 20, and the supporter 30 can be easily and accurately known. Accordingly, the aligning can be easily performed, and the installation time can be shortened.

Figure 5:
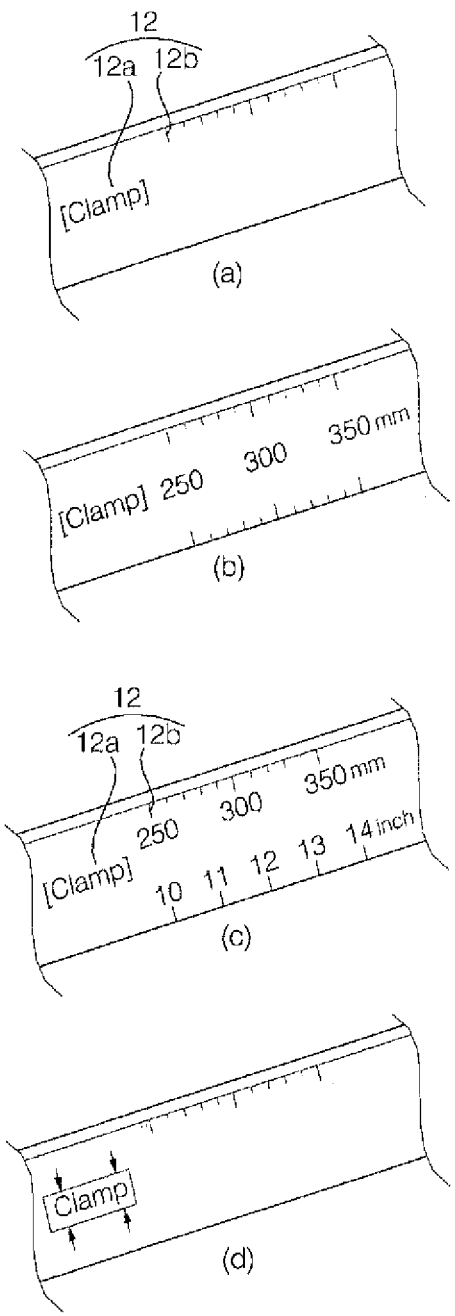
FIG. 5 illustrates various shapes of an align mark formed at or on the frame, according to embodiments of the present invention.

In the above embodiment, the align mark 12 has the scale shape. However, the embodiments of the invention are not limited thereto. The align mark having various shapes will be described with reference to FIG. 5. In FIG. 5, the embodiments where the align mark 12 is formed by printing or by coating with ink are illustrated by way of an example. Instead, the align mark 12 can have shapes shown in (a) to (c) of FIG. 4.

As shown in (a) of FIG. 5, the align mark 12 includes a first align mark 12a and a second align mark 12b having different shapes. The first align mark 12a has a character of "Clamp" for showing the position of the fixer 20 and symbols of "[" and "]" for showing boundaries of the fixer 20 (more specifically, the clamping member 210). The second align mark 12b has a scale shape. In this case, first, the solar cell module 10 and the supporter 30 are roughly aligned by using the second align mark 12b of the scale shape. After that, the fixer 20 (more specifically, the clamping member 210) are accurately aligned by the first align mark 12a, and the fastening member 224 is fastened. That is, by including the first align mark 12a and the second align mark 12b having the different shapes, the align property of the solar cell module 10, the fixer 20, and the supporter 30 can be enhanced.

As another modification, as shown in (b) of FIG. 5, the second align mark 12b of the scale shape includes an upper second align mark 12b formed at the upper portion and a lower second align marks 12b formed at the lower portion. Also, the scales of the upper and lower second align mark 12b have numbers. As another embodiment, only one of the upper and lower second align marks 12b may have number. In these cases, the align property with the supporter 30 can be more enhanced. Selectively, as shown in (c) of FIG. 5, the upper and lower second align marks 12b have numbers in different units. For example, the upper second align mark 12b uses a millimeter unit, and the lower second align mark 12*b* uses an inch unit. In this case, the align mark 12 can be applied to various applications or countries using various units. Thus, availability of the align mark 12 can be enhanced.

Or, as shown in (d) of FIG. 5, the shape of the first align mark 12*a* may be changed. That is, by using a rectangle and an arrow, the position of the fixer 20 can stand out more.

Likewise, the shapes of the align mark 12 can be variously changed. Thus, the align mark 12 may include various figures, symbols, numbers, characters, and/or scales.

Figure 7:
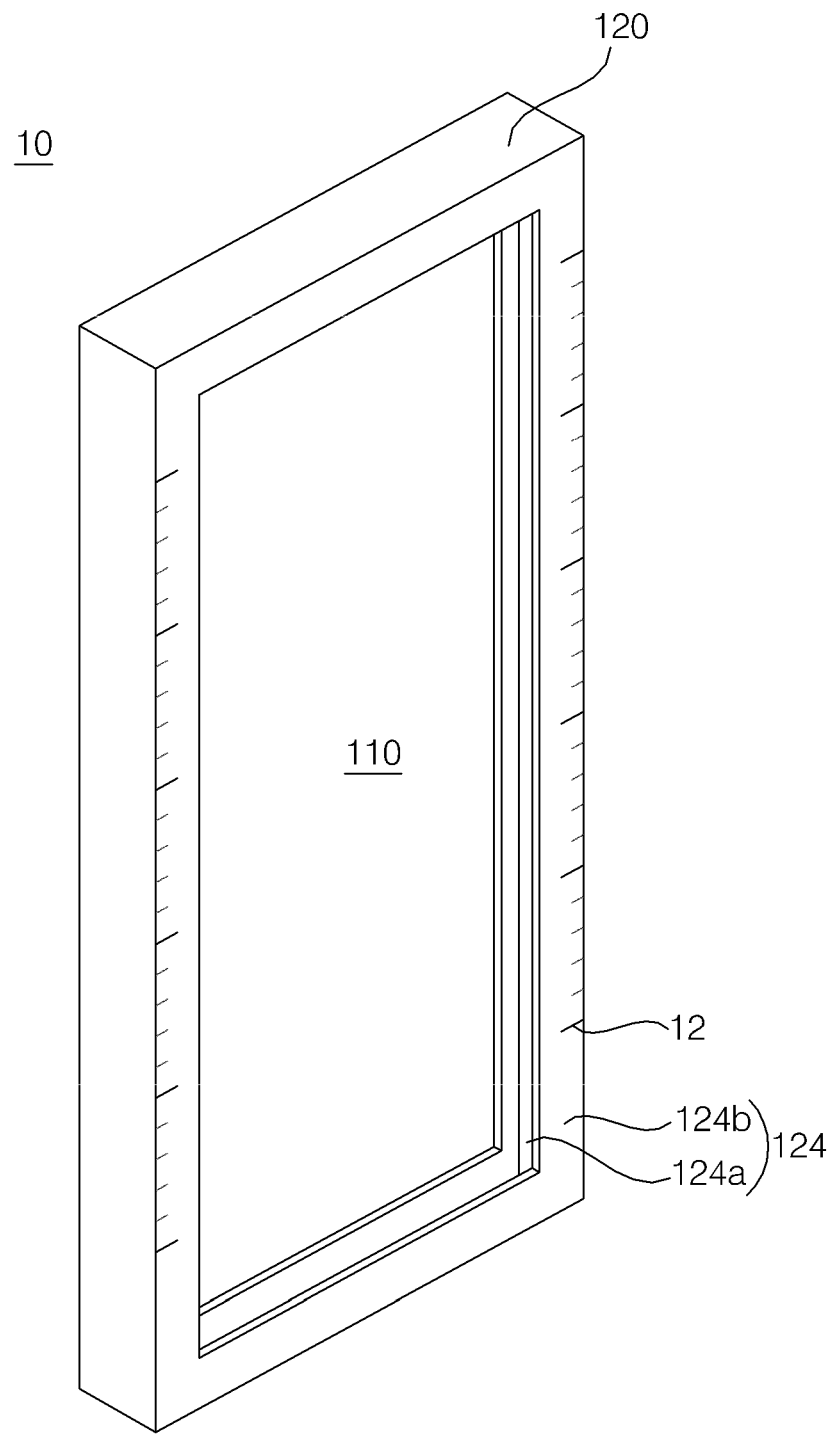
FIG. 7 is a perspective view illustrating a solar cell module for generating photovoltaic power including align marks formed on the frame according to an embodiment of the present invention.

In the above embodiment, the fixer 20 positioned between the side surfaces of the solar cell modules 10 is illustrative by an example. However, the embodiments of the invention are not limited thereto. According to the position of the fixer 20, the align mark 12 may be formed at a rear surface of the frame 120, which is illustrated in FIG. 7. Selectively, the align mark 12 may be formed at a front surface of the frame 120.

According to the embodiment, the align mark 12 for aligning with the fixer 20 and/or the supporter 30 is formed at the solar cell module 10. Thereby, aligning the solar cell module 10 with the fixer 20 and/or the supporter 30 can be easy. That is, the position where the fixer 20 and/or the supporter 30 will be installed can be known by the align mark 12 immediately and easily. Accordingly, the aligning thereof can be accurately performed in a short time.

Certain embodiments of the invention have been described. However, the invention is not limited to the specific embodiments described above; and various modifications of the embodiments are possible by those skilled in the art to which the invention belongs without leaving the scope defined by the appended claims.

What is claimed is:

1. A solar cell module comprising:
    a solar cell panel comprising at least one solar cell, wherein the solar cell panel includes a front surface where light is incident, a back surface opposite to the front surface, and a side surface connecting the front surface and the back surface; and
    a frame at a periphery of the solar cell panel,
    wherein the frame comprises an align mark for alignment,
    wherein the align mark is on a side surface of the frame that is at the side surface of the solar cell panel,
    wherein the side surface of the frame comprising the align mark faces another solar cell module or faces a fixer for fixing the solar cell module to another solar cell module; and wherein the align mark comprises a first align mark to indicate a position of the fixer and a second align mark having a scale.

2. The solar cell module according to claim 1, wherein the align mark comprises at least one of a figure, a scale, a number, a character, and a symbol.

3. The solar cell module according to claim 1, wherein the align mark comprises a protrusion or a depression that is an integral part of the frame.

4. The solar cell module according to claim 3, wherein the align mark is formed by irradiating with a laser to the frame or by pressing the frame with a press.

5. The solar cell module according to claim 1, wherein the align mark is separately formed from the frame and is positioned on the frame.

6. The solar cell module according to claim 5, wherein the align mark is formed on a film, and the film is attached on the frame.

7. The solar cell module according to claim 1, wherein the align mark is formed at least one of a front, a side, and a back surface of the frame that is positioned at a side surface of the solar cell panel.

8. The solar cell module according to claim 1, wherein the frame comprises:
    a first portion where the periphery of the solar cell panel is inserted; and
    a second portion extending from the first portion in a rear direction of the solar cell panel.

9. An apparatus for generating photovoltaic power, the apparatus comprising:
    a solar cell module comprising a solar cell panel comprising at least one solar cell and a frame at a periphery of the solar cell panel;
    wherein the solar cell panel includes a front surface where light is incident, a back surface opposite to the front surface, and a side surface connecting the front surface and the back surface;
    a fixer; and
    a supporter where the solar cell module is fixed by the fixer,
    wherein the frame comprises an align mark that is used to align the solar cell module with at least one of the supporter and the fixer, and
    wherein the align mark is on a side surface of the frame that is at the side surface of the solar cell panel,
    wherein the side surface of the frame having the align mark faces another solar cell module or faces the fixer; and
    wherein the align mark comprises a first align mark to indicate a position of the fixer and a second align mark having a scale.

10. The apparatus according to claim 9, wherein the align mark comprises at least one of a figure, a scale, a number, a character, and a symbol.

11. The apparatus according to claim 9, wherein the align mark comprises a protrusion or a depression that is an integral part of the frame.

12. The apparatus according to claim 11, wherein the align mark is formed by irradiating with a laser to the frame or by pressing the frame with a press.

13. The apparatus according to claim 9, wherein the align mark is separately formed from the frame and is positioned on the frame.

14. The apparatus according to claim 13, wherein the align mark is formed on a film, and the film is attached on the frame.

15. The apparatus according to claim 9, wherein the align mark is further on a front surface, and a back surface of the frame.

16. The apparatus according to claim 9, wherein the fixer comprises:
    a clamping member to surround a side surface and a part of a front surface of the frame; and
    a fastening member to fix the clamping member to the supporter.

17. The apparatus according to claim 16, wherein the clamping member comprises:
    a bottom portion to position on the supporter;
    a side portion to position on the side surface of the frame; and
    a hooking portion to position on the front surface of the frame.

18. The apparatus according to claim 9, wherein the frame comprises:
    a first portion where the periphery of the solar cell panel is inserted; and
    a second portion extending from the first portion in a rear direction of the solar cell panel.

* * * * *